United States Patent
Chen et al.

(10) Patent No.: US 9,881,963 B1
(45) Date of Patent: Jan. 30, 2018

(54) HORIZONTAL AVALANCHE PHOTODIODE

(71) Applicant: OMNIVISION TECHNOLOGIES, INC., Santa Clara, CA (US)

(72) Inventors: Gang Chen, San Jose, CA (US); Eric A. G. Webster, Mountain View, CA (US); Duli Mao, Sunnyvale, CA (US); Vincent Venezia, Los Gatos, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 21 days.

(21) Appl. No.: 15/263,936

(22) Filed: Sep. 13, 2016

(51) Int. Cl.
*H01L 27/00* (2006.01)
*H01L 27/146* (2006.01)
*H01L 31/107* (2006.01)

(52) U.S. Cl.
CPC .... *H01L 27/14643* (2013.01); *H01L 27/1463* (2013.01); *H01L 27/14634* (2013.01); *H01L 27/14683* (2013.01); *H01L 31/107* (2013.01)

(58) Field of Classification Search
CPC .......... H01L 27/1463; H01L 27/14634; H01L 27/14643; H01L 27/1469; H01L 31/107

USPC ..... 250/208.1, 214.1, 214 VT, 207; 257/431
See application file for complete search history.

(56) References Cited

U.S. PATENT DOCUMENTS

2015/0200222 A1* 7/2015 Webster ............... H01L 31/107
250/208.1

* cited by examiner

*Primary Examiner* — Kevin Pyo
(74) *Attorney, Agent, or Firm* — Christensen O'Connor Johnson Kindness PLLC

(57) ABSTRACT

An avalanche photodiode sensor includes a plurality of avalanche photodiodes disposed in a semiconductor material where individual avalanche photodiodes in the plurality of avalanche photodiodes have an internal electric field parallel with a first surface of the semiconductor material. The individual avalanche photodiodes in the plurality of avalanche photodiodes include a p-doped semiconductor region which extends into the semiconductor material, and an n-doped semiconductor region which extends into the semiconductor material. The internal electric field extends between the p-doped semiconductor region and the n-doped semiconductor region. Processing methods as examples are also proposed.

21 Claims, 6 Drawing Sheets

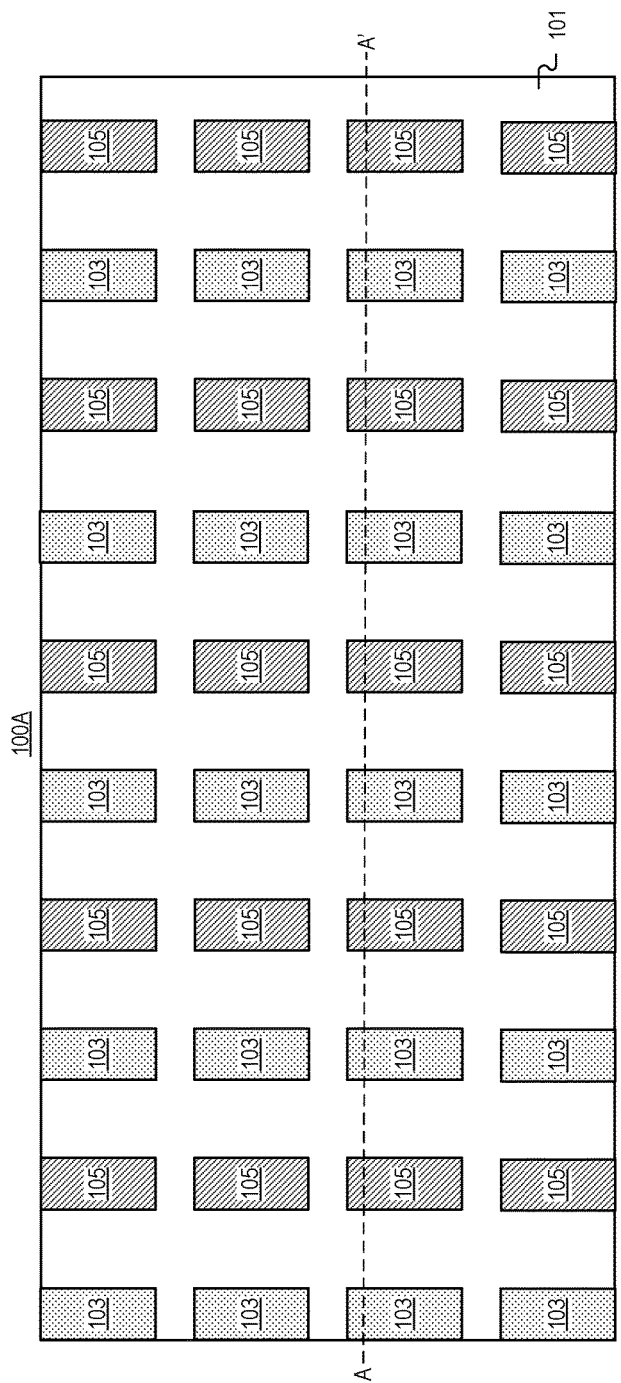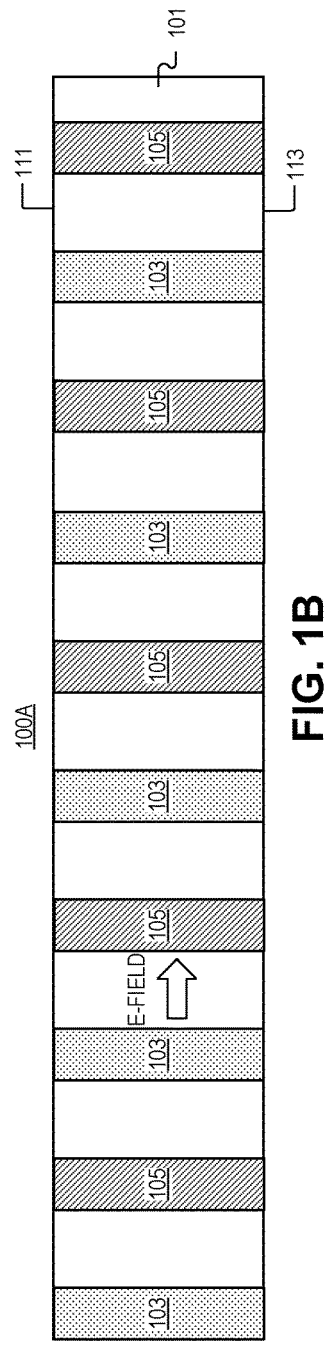
FIG. 1A
FIG. 1B

HORIZONTAL AVALANCHE PHOTODIODE

TECHNICAL FIELD

This disclosure relates generally to semiconductor fabrication and more specifically to avalanche photodiodes.

BACKGROUND INFORMATION

Photodetectors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these sensors.

One type of photodetector is a single-photon avalanche diode (SPAD). A SPAD (also sometimes referred to as a Geiger-mode avalanche photodiode (G-APD)) is a solid-state photodetector capable of detecting a low intensity signal, such as low as a single photon. SPAD imaging sensors are semiconductor photosensitive devices made up of an array of SPAD regions that are fabricated on a semiconductor substrate. The SPAD regions produce an output pulse when struck by a photon. The SPAD regions have a p-n junction that is reverse biased above the breakdown voltage such that a single photo-generated carrier can trigger an avalanche multiplication process that causes current at the output of the photon detection cell to reach its final value quickly. This avalanche current continues until the avalanche process is slowed by reducing the bias voltage. The photon signal received by the sensor can be detected and measured with support circuitry.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 1A is a top-down view of an example sensor, in accordance with the teachings of the present invention.

FIG. 1B is a cross sectional view of the sensor of FIG. 1A as cut along line A-A', in accordance with the teachings of the present invention.

Figure 1C:
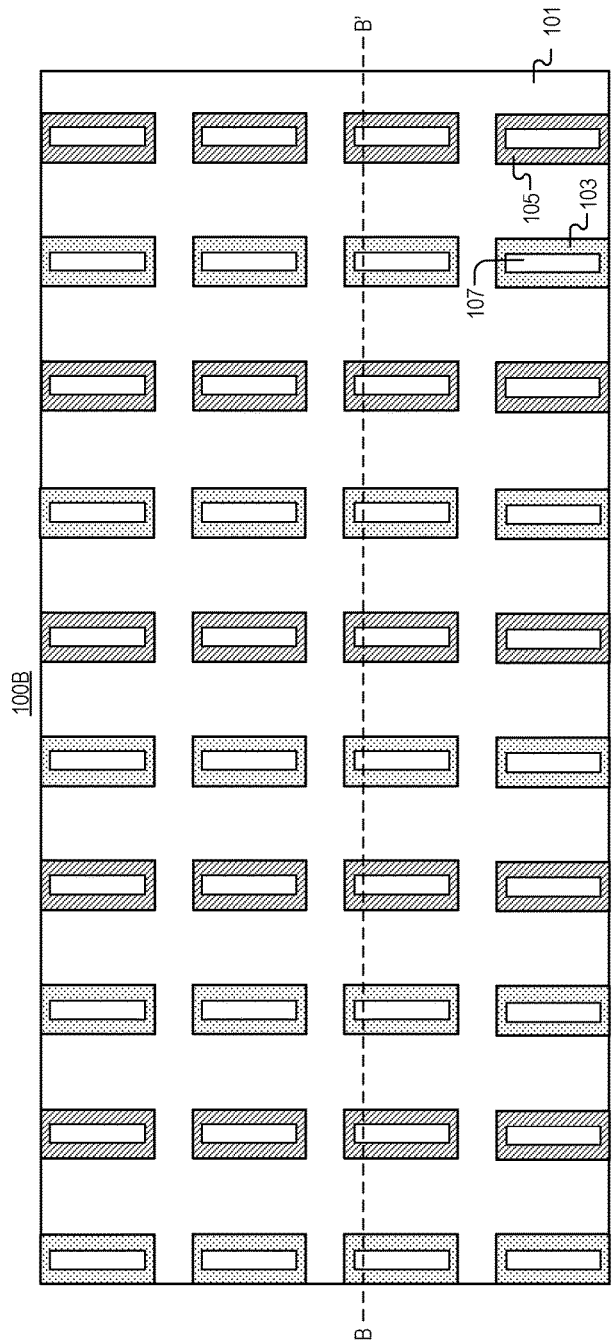
FIG. 1C is a top-down view of an example sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for horizontal avalanche photodiodes are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1A is a top-down view of an example avalanche photodiode sensor 100A. Avalanche photodiode sensor 100A includes a plurality of avalanche photodiodes disposed in semiconductor material 101. Individual avalanche photodiodes in the plurality of avalanche photodiodes have an internal electric field (i.e., E-FIELD) parallel with first surface 111 (see FIG. 1B) of semiconductor material 101. Individual avalanche photodiodes also include p-doped semiconductor region 103 and n-doped semiconductor region 105 which extend into semiconductor material 101. The internal electric field (i.e., E-FIELD) extends laterally between p-doped semiconductor region 103 and n-doped semiconductor region 105. In other words, the active region of the avalanche photodiode is disposed laterally in semiconductor material 101 between p-doped semiconductor region 103 and n-doped semiconductor region 105 instead of vertically (like a conventional avalanche photodiode). In the depicted example, a photon may be absorbed by semiconductor material 101 resulting in exciton (bound hole-electron pair) formation. The hole and electron of the exciton generated in semiconductor material 101 (between p-doped semiconductor region 103 and n-doped semiconductor region 105) may be separated by the internal electric field, and travel in a direction parallel with first surface 111 of the semiconductor material 101 to reach p-doped semiconductor region 103 and n-doped semiconductor region 105. In response to incident light (and application of a reverse bias), an avalanche breakdown may occur in a direction parallel with first surface 111 of semiconductor material 101. In the depicted example, p-doped semiconductor region 103 and n-doped semiconductor region 105 may be formed by ion implantation or the like. However, in other examples other fabrication techniques may be used in accordance with the teachings of the present invention (see e.g., FIG. 3B).

FIG. 1B is a cross sectional view of the sensor 100A of FIG. 1A as cut along line A-A'. As illustrated, the electric field between p-doped semiconductor region 103 and n-doped semiconductor region 105 is formed laterally. In other words, electric field lines may be densest between p-doped semiconductor region 103 and n-doped semiconductor region 105. As shown, p-doped semiconductor region 103 and n-doped semiconductor region 105 may extend all the way through semiconductor material 101; however, in other examples, p-doped semiconductor region 103 and n-doped semiconductor region 105 may not extend all the way through semiconductor material 101. For example, p-doped semiconductor region 103 and n-doped semiconductor region 105 may extend from first surface 111 more than halfway through semiconductor material 101, but not all the way to second surface 113.

FIG. 1C is a top-down view of an example avalanche photodiode sensor 100B. Avalanche photodiode sensor 100B is similar in many respects to sensor 100A of FIG. 1A; however, sensor 100B differs in that sensor 100B includes plurality of trenches 107 disposed in semiconductor material 101. Individual trenches 107 in the plurality of trenches 107 are disposed within p-doped semiconductor region 103 and n-doped semiconductor region 105. Trenches 107 may electrically isolate the individual avalanche photodiodes in the plurality of avalanche photodiodes. In one example, the plurality of trenches 107 are backfilled with an oxide material such as silicon oxide, hafnium oxide, or the like, and possibly with more than one layer. However, in other examples trenches 107 may be backfilled with nitrides or oxynitrides such as silicon nitride or silicon oxynitrides, or combinations of several layers of these structures.

Figure 1D:
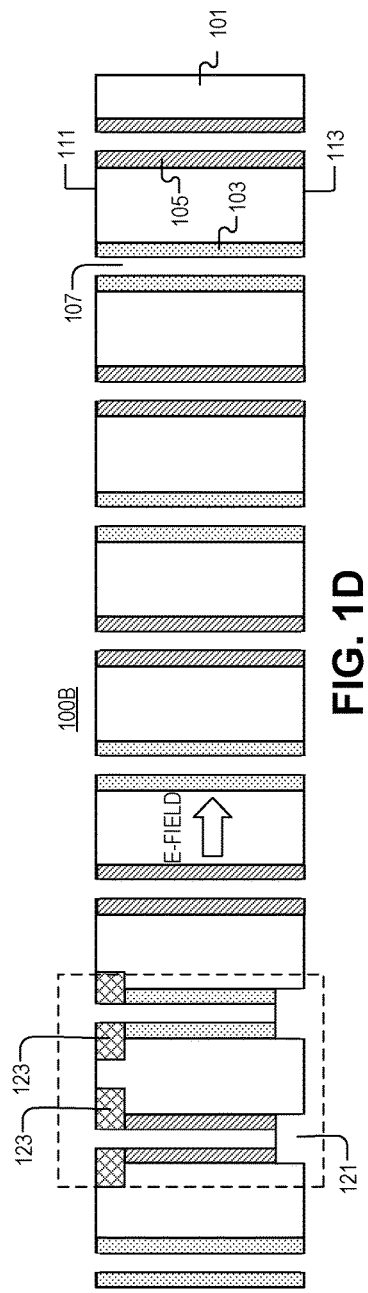
FIG. 1D is a cross sectional view of the sensor of FIG. 1C as cut along line B-B', in accordance with the teachings of the present invention.

FIG. 1D is a cross sectional view of the sensor 100B of FIG. 1C as cut along line B-B'. While FIG. 1D is similar to FIG. 1B, trenches 107 extend all the way through semiconductor material 101. It is important to note that while trenches 107 extending through semiconductor material 101 may serve the important purpose of isolating individual avalanche photodiodes, trenches 107 may also be used to fabricate the doped structures by diffusing p-type dopant (e.g., diborane gas) and n-type dopant (e.g., phosphine gas) into sidewalls of individual trenches 107. This may form the plurality of p-doped semiconductor regions 103 and plurality of n-doped semiconductor regions 105 (as will be discussed in greater detail later).

Also depicted in FIG. 1D is a portion of the avalanche diode sensor 100B which has been processed to reduce potentially deleterious surface effects (see dashed line box). As shown, edges of p-doped semiconductor region 103 and edges of n-doped semiconductor region 105 disposed proximate to first surface 111 of semiconductor material 101 are counter doped (depicted as blocks 123) to reduce the internal electric field proximate to the first surface 111. In other words, n-dopant may be implanted into edges of p-doped semiconductor region 103 and p-dopant may be implanted into edges of n-doped semiconductor region 105 to reduce the electric field along the edges of semiconductor material 101 and prevent unwanted breakdown. Alternatively, edges of p-doped semiconductor region 103 and edges of n-doped semiconductor region 105 disposed proximate to second surface 113 (opposite first surface 111) of semiconductor material 101 are etched away 121 to reduce the internal electric field. It is worth noting that either of these techniques may be employed on the either surface of semiconductor material 101. Reducing the electric field proximate to the surfaces of semiconductor material 101 may, in some examples, prevent unwanted breakdown of the plurality of avalanche photodiodes when a reverse bias is applied.

Figure 1E:
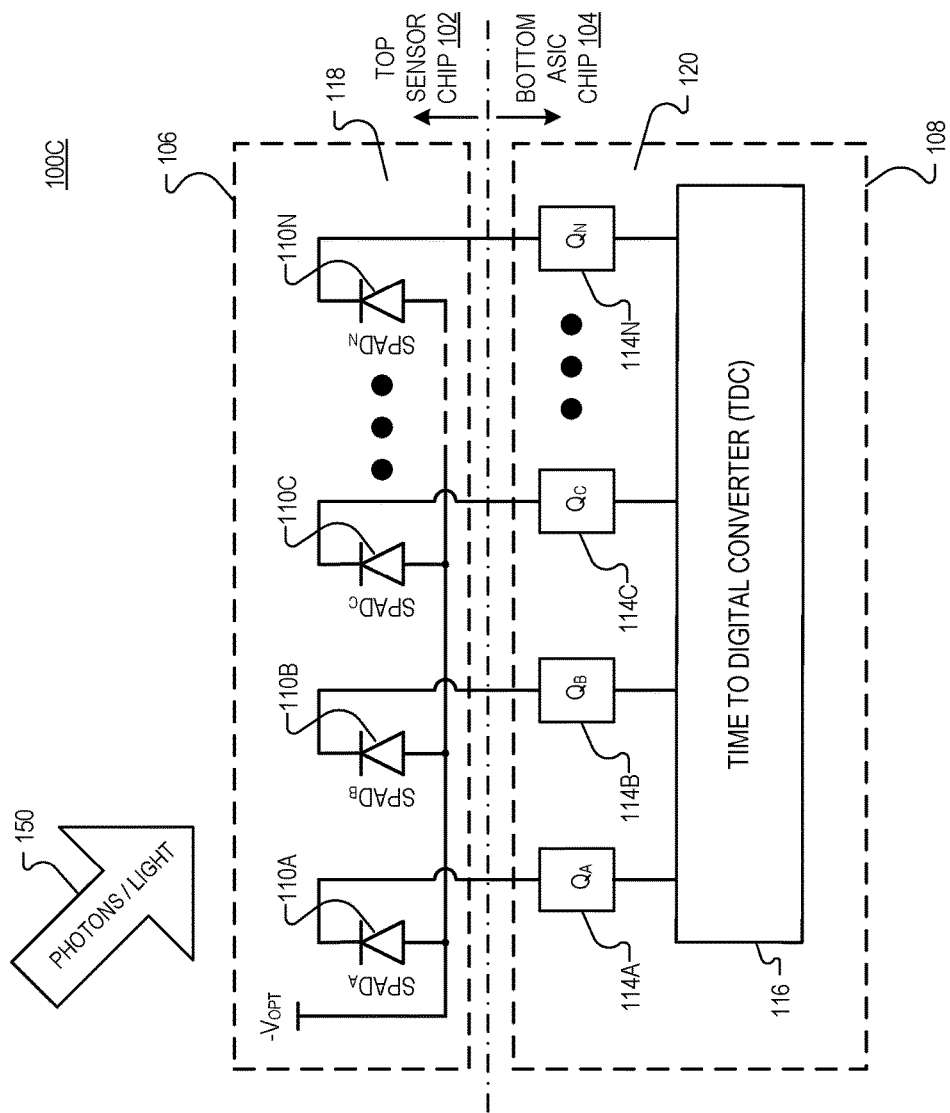
FIG. 1E illustrates a circuit diagram of the sensor in FIGS. 1A-1D, in accordance with the teachings of the present invention.

FIG. 1E illustrates a circuit diagram of sensor 100C which may be the sensor in FIGS. 1A-1D. Array 106 may include single photon avalanche photodiodes (SPADs) in a top sensor chip 102 that is stacked with a bottom application specific integrated circuit chip (ASIC) 104 with support circuitry 108, in accordance with the teachings of the present invention. Sensor chip 102 and ASIC chip 104 may also be built onto the same chip, depending on technology availability, and cost-performance considerations. In the depicted example, photon sensing system 100 includes a photon detection array 106 with SPAD photon detection devices including $SPAD_A$ 110A, $SPAD_B$ 110B, $SPAD_C$ 110C, ... $SPAD_N$ 110N disposed in a first semiconductor layer 118 of top sensor chip 102. In the example depicted, support circuitry 108 disposed in a second semiconductor layer 120 of a bottom ASIC chip 104 is coupled to photon detection array 106 to support operation of $SPAD_A$ 110A, $SPAD_B$ 110B, $SPAD_C$ 110C, ... $SPAD_N$ 110N. For instance, in the depicted example, the support circuitry 108 in bottom ASIC chip 104 includes quenching circuitry $Q_A$ 114A, $Q_B$ 114B, $Q_C$ 114C, ... $Q_N$ 114N coupled to each respective $SPAD_A$ 110A, $SPAD_B$ 110B, $SPAD_C$ 110C, ... $SPAD_N$ 110N. In the example, support circuitry 108 includes other circuitry coupled quenching circuitry $Q_A$ 114A, $Q_B$ 114B, $Q_C$ 114C, ... $Q_N$ 114N such as for example time to digital converter (TDC) circuitry 116 to support operation of $SPAD_A$ 110A, $SPAD_B$ 110B, $SPAD_C$ 110C, ... $SPAD_N$ 110N. It is appreciated of course that support circuitry 108 may include other types of circuitry such as for example counter circuitry, timing circuitry, readout circuitry, control circuitry, functional logic, or other well-known SPAD support circuitry, which are not shown or described in detail to avoid obscuring certain aspects in accordance with the teachings of the present invention. In addition, it is noted that the example depicted in FIG. 1, $SPAD_A$ 110A, $SPAD_B$ 110B, $SPAD_C$ 110C, ... $SPAD_N$ 110N are illustrated as being arranged in a single row. However, in other examples, it is appreciated that pixels of the pixel array may be arranged into a single column, or into a two-dimensional array of columns and rows.

In the depicted example, it is noted that the anode of each $SPAD_A$ 110A, $SPAD_B$ 110B, $SPAD_C$ 110C, ... $SPAD_N$ 110N is coupled to a negative operational voltage $-V_{OPT}$, and that the cathode of each $SPAD_A$ 110A, $SPAD_B$ 110B, $SPAD_C$ 110C, ... $SPAD_N$ 110N is coupled to quenching circuitry $Q_A$ 114A, $Q_B$ 114B, $Q_C$ 114C, ... $Q_N$ 114N. When the SPADs of photon detection array 106 are illuminated with photons/light 150, the resulting output pulses from $SPAD_A$ 110A, $SPAD_B$ 110B, $SPAD_C$ 110C, ... $SPAD_N$ 110N, and quenching circuitry $Q_A$ 114A, $Q_B$ 114B, $Q_C$ 114C, ... $Q_N$ 114N, are detected with TDC circuitry 116 to measure and/or time the arrival of incident photons/light 150 in accordance with the teachings of the present invention. In the illustrated example, each $SPAD_A$ 110A, $SPAD_B$ 110B, $SPAD_C$ 110C, ... $SPAD_N$ 110N is reverse biased to or above the breakdown voltage of each $SPAD_A$ 110A, $SPAD_B$ 110B, $SPAD_C$ 110C, ... $SPAD_N$ 110N. In response to a single photo-generated carrier from incident photons/light 150, an avalanche multiplication process is triggered that causes an avalanche current at the output of each $SPAD_A$ 110A, $SPAD_B$ 110B, $SPAD_C$ 110C, . . . $SPAD_N$ 110N. This avalanche current self-quenches in response to a voltage drop that is developed across the quenching element (e.g., quenching circuitry $Q_A$ 114A, $Q_B$ 114B, $Q_C$ 114C, . . . $Q_N$ 114N), which causes the bias voltage across the SPAD to drop. After the quenching of the avalanche current, the voltage across the SPAD recovers to above the bias voltage and then the SPAD is ready to be triggered again. In the depicted example, individual avalanche photodiodes are electrically coupled to individual quenching elements to halt an avalanche breakdown. The resulting output pulse of each quenching circuit $Q_A$ 114A, $Q_B$ 114B, $Q_C$ 114C, . . . $Q_N$ 114N is received by TDC circuitry 116, which can measure the time of arrival of each photon of incident photons/light 150 in accordance with the teachings of the present invention. Individual avalanche photodiodes may be electrically coupled to one or more digital counters included in TDC circuitry 116 to count a number of photons absorbed by the avalanche photodiode sensor 100C.

Conventional SPAD designs that incorporate SPADs on the same chips as the SPAD support circuitry fabricated using a standard CMOS process may suffer from reduced fill factor on the imaging plane due to the area occupied by the CMOS circuits themselves. Accordingly, one advantage of implementing a stacked chip structure in accordance with the teachings of the present invention is that with the SPADs on the top chip and with the support circuitry on a separate bottom chip fill factor is enhanced. In other words, one or more digital counters are at least partially disposed in a second semiconductor material, and the second semiconductor material is wafer bonded to the semiconductor material containing the SPAD. Thus, the fill factor of the SPAD imaging array on the top chip does not need to be reduced in order to provide room to accommodate the CMOS circuitry on the same chip in accordance with the teachings of the present invention.

Figure 2:
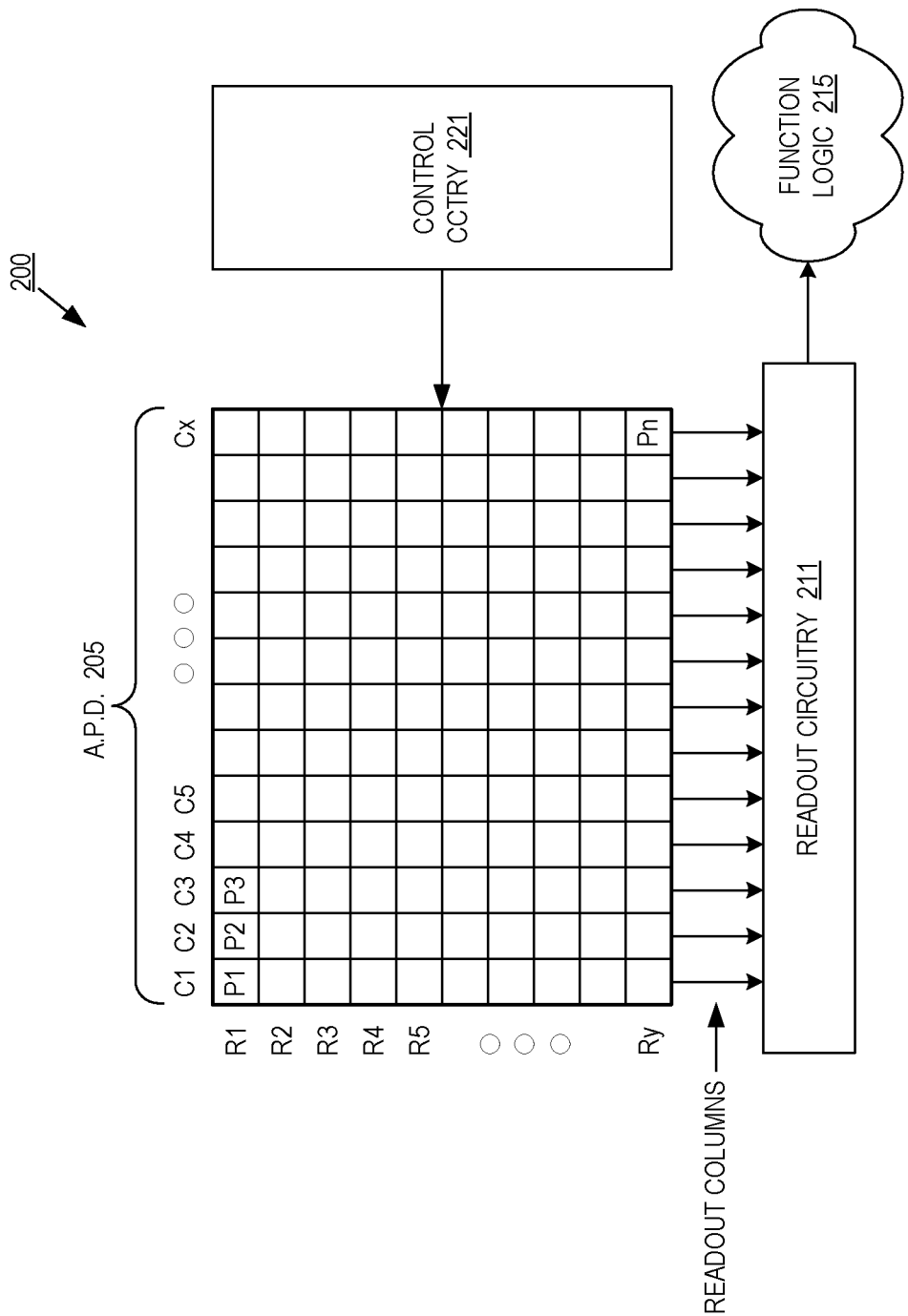
FIG. 2 illustrates a block diagram of a system which may include the sensor of FIGS. 1A-1E, in accordance with the teachings of the present invention.

FIG. 2 illustrates a block diagram of system 200 which may include the sensors of FIGS. 1A-1E. System 200 includes avalanche photodiode array 205, control circuitry 221, readout circuitry 211, and function logic 215. In one example, pixel array 205 is a two-dimensional (2D) array of avalanche photodiodes (e.g., photodiodes P1, P2 . . . , Pn). As illustrated, photodiodes are arranged into rows (e.g., rows R1 to Ry) and columns (e.g., column C1 to Cx) to acquire photons, time of flight measurements, data signals, etc. However, photodiodes do not have to be arranged into rows and columns and may take other configurations.

In one example, control circuitry 221 and readout circuitry 211 may include the circuitry shown in FIG. 1E. For example, control circuitry 221 may include quenching elements. Readout circuitry may include digital counters or the like to count the number of photons absorbed.

In one example, system 200 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to system 200, extract data from system 200, or manipulate data supplied by system 200.

Figure 3A:
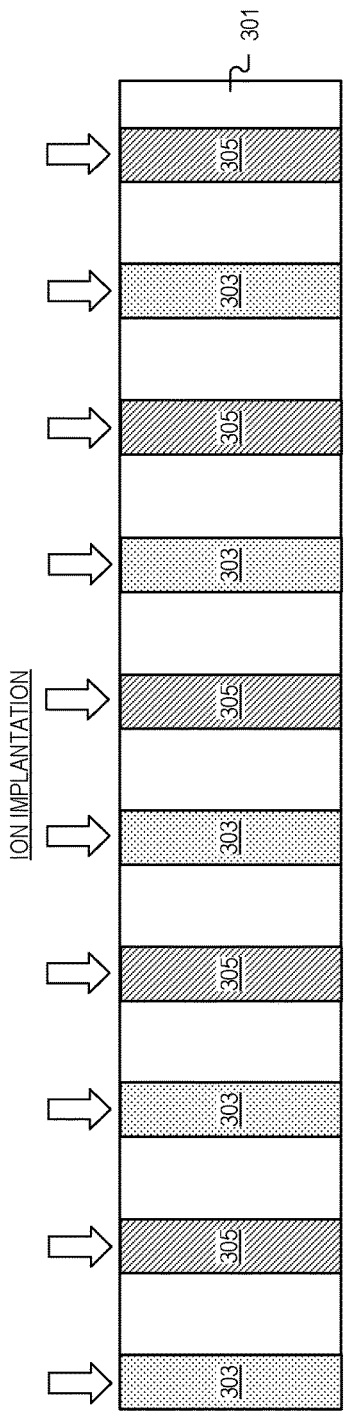
FIG. 3A illustrates an example method for forming the sensor of FIGS. 1A-1B, in accordance with the teachings of the present invention.

FIG. 3A illustrates an example method for forming the sensor of FIGS. 1A-1B. As illustrated, p-doped semiconductor regions 303 and n-doped semiconductor regions 305 are implanted using ion implantation or a related technique. Semiconductor material 301 may be a wafer, or may be an epitaxial layer gown on a suitable substrate.

Figure 3B:
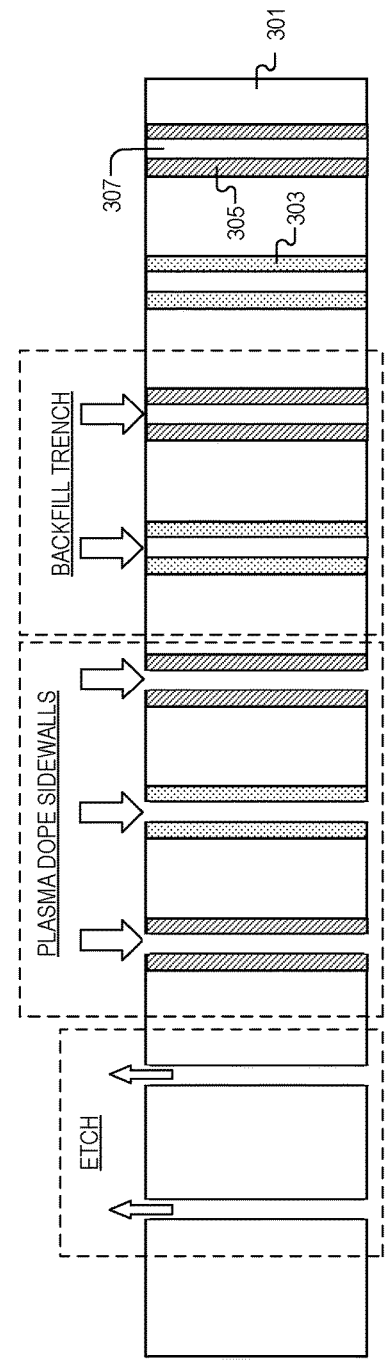
FIG. 3B illustrates an example method for forming the sensor of FIGS. 1C-1D, in accordance with the teachings of the present invention.

FIG. 3B illustrates an example method for forming the sensor of FIGS. 1C-1D. In this example, semiconductor material 301 is etched to form plurality of trenches 307 in the semiconductor material 301. P-type dopant and n-type dopant are then diffused into sidewalls of individual trenches 307 in plurality of trenches 307 to form plurality of p-doped semiconductor regions 303 and plurality of n-doped semiconductor regions 305, respectively. This may be achieved by plasma doping the sidewalls of trenches 307. As shown, trenches 307 may then be backfilled with an oxide material or multiple layers of films of different materials.

Figure 4:
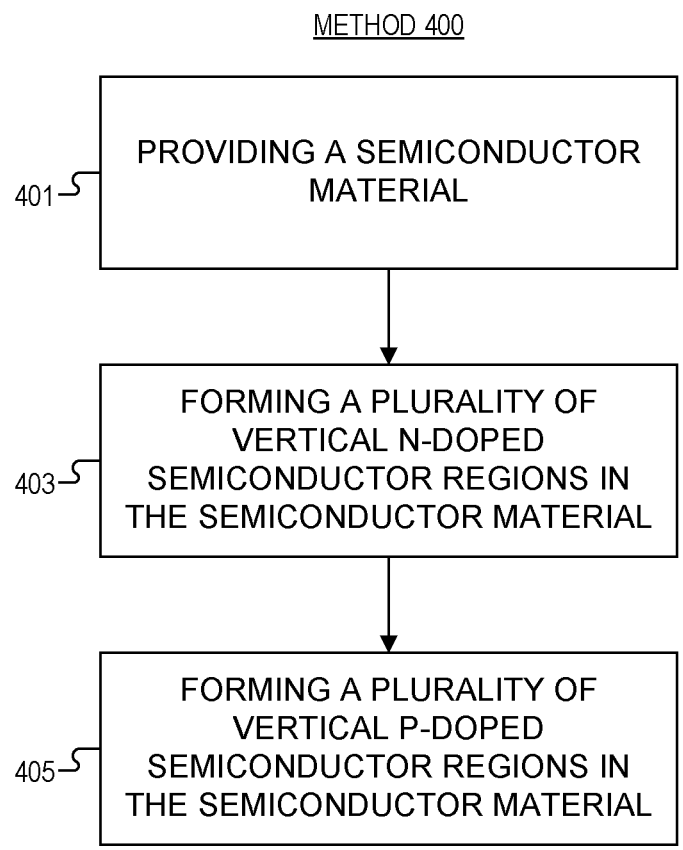
FIG. 4 illustrates a method of sensor fabrication, in accordance with the teachings of the present invention.

FIG. 4 illustrates a method 400 of sensor fabrication. The order in which some or all process blocks appear in method 400 should not be deemed limiting. Rather, one of ordinary skill in the art having the benefit of the present disclosure will understand that some of method 400 may be executed in a variety of orders not illustrated, or even in parallel. Furthermore, method 400 may omit certain process blocks in order to avoid obscuring certain aspects. Alternatively, method 400 may include additional process blocks that may not be necessary in some embodiments/examples of the disclosure.

Block 401 illustrates providing a semiconductor material. In one example the semiconductor material may be a silicon wafer; however, other semiconductor materials may be used such as any group 3 elements (B, Al, Ga, In, Tl), group 4 elements (C, Si, Ge, Sn, Pb), group 5 elements (N, P, As, Sb, Bi), or the like, or even a compound material. Moreover some materials may be used in wafer form, or may be epitaxial grown via chemical vapor deposition, atomic layer deposition, molecular beam epitaxy, or the like.

Block 403 shows forming a plurality of n-doped semiconductor regions in the semiconductor material. The plurality of n-doped semiconductor regions may extend into the semiconductor material in a direction from a first surface to a second surface of the semiconductor material (i.e., substantially vertically).

Block 405 discusses forming a plurality of p-doped semiconductor regions in the semiconductor material. The plurality of p-doped semiconductor regions may extend into the semiconductor material in the direction from the first surface to the second surface (i.e., substantially vertically) at the same or a different depth as the n-doped semiconductor material. Thus the p-doped and n-doped semiconductor regions are substantially parallel with each other in the semiconductor material. This results in an electric field forming between individual n-doped semiconductor regions and individual p-doped semiconductor regions. Upon absorption of an incident photon and application of a reverse bias, the electric field is sufficient to cause an avalanche breakdown in a direction parallel to the first surface of the semiconductor material. Accordingly, the process steps 401-405 result in a plurality of horizontal avalanche photodiodes being disposed in a semiconductor material.

In one or more examples, dopant deposited into the p-doped semiconductor regions and n-doped semiconductor regions may be diffused to form a p-n junction in the area between the p-doped semiconductor regions and the n-doped semiconductor regions. This may be achieved through thermal annealing or diffusion techniques in accordance with the teachings of the present disclosure.

In one example forming the plurality of n-doped semiconductor regions and the plurality of p-doped semiconductor regions includes etching a plurality of trenches into the semiconductor material, and diffusing p-type dopant and n-type dopant into sidewalls of individual trenches. In one example, a section of the plurality of n-doped semiconductor regions and the plurality of p-doped semiconductor regions disposed proximate to the first surface of the semiconductor material are counter doped to reduce the electric field proximate to the first surface. In some examples, this may reduce destructive breakdown of the diodes. Similarly, a section of the plurality of n-doped semiconductor regions and p-doped semiconductor regions disposed proximate to the second surface of the semiconductor material may be etched away to achieve the same or a similar result. In one or more example, the trenches may be backfilled with an oxide, metal, and/or semiconductor material to produce electrical isolation between the diodes.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An avalanche photodiode sensor, comprising:
a plurality of avalanche photodiodes disposed in a semiconductor material wherein individual avalanche photodiodes in the plurality of avalanche photodiodes have an internal electric field parallel with a first surface of the semiconductor material, and wherein the individual avalanche photodiodes in the plurality of avalanche photodiodes include:
a p-doped semiconductor region which extends into the semiconductor material; and
an n-doped semiconductor region which extends into the semiconductor material, and wherein the internal electric field extends between the p-doped semiconductor region and the n-doped semiconductor region.

2. The avalanche photodiode sensor of claim 1, wherein a hole and an electron of an exciton generated in the semiconductor material between the p-doped semiconductor region and the n-doped semiconductor region are separated by the internal electric field and travel in a direction parallel with the first surface of the semiconductor material to reach the p-doped semiconductor region and the n-doped semiconductor region.

3. The avalanche photodiode sensor of claim 1, wherein in response to incident light and application of a reverse bias, an avalanche breakdown occurs in a direction parallel with the first surface of the semiconductor material.

4. The avalanche photodiode sensor of claim 1, further comprising a plurality of trenches disposed in the semiconductor material, wherein individual trenches in the plurality of trenches are disposed within the p-doped semiconductor region and the n-doped semiconductor region and electrically isolate the individual avalanche photodiodes in the plurality of avalanche photodiodes.

5. The avalanche photodiode sensor of claim 4, wherein the plurality of trenches is backfilled with an oxide material.

6. The avalanche photodiode sensor of claim 1, wherein edges of the p-doped semiconductor region and edges of the n-doped semiconductor region disposed proximate to the first surface of the semiconductor material are counter doped to reduce the internal electric field proximate to the first surface.

7. The avalanche photodiode sensor of claim 1, wherein edges of the p-doped semiconductor region and edges of the n-doped semiconductor region disposed proximate to a second surface, opposite the first surface, of the semiconductor material are etched away to reduce the internal electric field proximate to the second surface.

8. The avalanche photodiode sensor of claim 1, wherein the individual avalanche photodiodes are electrically coupled to individual quenching elements to halt an avalanche breakdown, and the individual avalanche photodiodes are electrically coupled to one or more digital counters to count a number of photons absorbed by the avalanche photodiode sensor.

9. The avalanche photodiode sensor of claim 8, wherein the one or more digital counters are at least partially disposed in a second semiconductor material, and wherein the second semiconductor material is wafer bonded to the semiconductor material.

10. An imaging system including:
a plurality of avalanche photodiodes disposed in a semiconductor material, including:
a p-doped semiconductor region which extends into the semiconductor material in a direction from a first surface of the semiconductor material to a second surface of the semiconductor material, wherein the first surface is opposite the second surface; and
an n-doped semiconductor region which extends into the semiconductor material in the direction from the first surface to the second surface, wherein an internal electric field extends parallel to the first surface between the p-doped semiconductor region and the n-doped semiconductor region, and wherein, in response to an absorbed photon and application of a reverse bias, an avalanche breakdown occurs between the n-doped semiconductor region and the p-doped semiconductor region;
a plurality of quenching elements coupled to the plurality of avalanche photodiodes to arrest the avalanche breakdown; and
digital counters electrically coupled to the plurality of avalanche photodiodes to count a number of the absorbed photons.

11. The imaging system of claim 10, further comprising trenches etched into the n-doped semiconductor region and the p-doped semiconductor region, wherein the trenches extend through the semiconductor material.

12. The imaging system of claim 11, wherein the trenches are backfilled with an oxide material, and wherein the trenches electrically isolate individual avalanche photodiodes disposed in the semiconductor material.

13. The imaging system of claim 10, wherein portions of the n-doped semiconductor region and the p-doped semiconductor region disposed proximate to the first surface are counter doped to reduce the internal electric field proximate to the first surface.

14. The imaging system of claim 10, wherein portions of the n-doped semiconductor region and the p-doped semiconductor region disposed proximate to the second surface are etched away to reduce the internal electric field proximate to the second surface.

15. The imaging system of claim 10, wherein in repose to the absorbed photon an exciton is formed in the semiconductor material between the n-doped semiconductor region and the p-doped semiconductor region, and wherein the exciton is separated into a hole and an electron, wherein the hole and the electron travel parallel to the first surface into the p-doped semiconductor region and the n-doped semiconductor region.

16. A method of avalanche photodiode sensor fabrication, comprising:
   providing a semiconductor material;
   forming a plurality of n-doped semiconductor regions in the semiconductor material, wherein the plurality of n-doped semiconductor regions extends into the semiconductor material in a direction from a first surface to a second surface of the semiconductor material, wherein the first surface is opposite the second surface;
   forming a plurality of p-doped semiconductor regions in the semiconductor material, wherein the plurality of p-doped semiconductor regions extends into the semiconductor material in the direction from the first surface to the second surface, and wherein an electric field between an individual n-doped semiconductor region in the plurality of n-doped semiconductor regions an individual p-doped semiconductor region in the plurality of p-doped semiconductor regions is, upon absorption of an incident photon and application of a reverse bias, sufficient to cause an avalanche breakdown in a direction parallel to the first surface of the semiconductor material.

17. The method of claim 16, wherein forming the plurality of n-doped semiconductor regions and the plurality of p-doped semiconductor regions includes:
   etching a plurality of trenches into the semiconductor material; and
   diffusing p-type dopant and n-type dopant into sidewalls of individual trenches in the plurality of trenches to form the plurality of p-doped semiconductor regions and the plurality of n-doped semiconductor regions, respectively.

18. The method of claim 17, further comprising backfilling the trenches with at least one material.

19. The method of claim 16, further comprising counter doping a section of the plurality of n-doped semiconductor regions and the plurality of p-doped semiconductor regions disposed proximate to the first surface of the semiconductor material.

20. The method of claim 16, further comprising etching away a section of the plurality of n-doped semiconductor regions and p-doped semiconductor regions disposed proximate to the second surface of the semiconductor material.

21. The method of claim 16, wherein forming the plurality of n-doped semiconductor regions and the plurality of p-doped semiconductor regions includes at least one of plasma doping or ion implantation of n-type dopant and p-type dopant, respectively.

* * * * *